United States Patent [19]

Davis

[11] 4,030,044

[45] June 14, 1977

[54] MONOLITHIC AMPLIFIER HAVING A BALANCED, DOUBLE-TO-SINGLE ENDED CONVERTER

[75] Inventor: Walter Richard Davis, Tempe, Ariz.

[73] Assignee: Motorola, Inc., Schaumburg, Ill.

[22] Filed: Nov. 13, 1975

[21] Appl. No.: 631,755

[52] U.S. Cl. .............................. 330/30 D; 330/17; 330/69
[51] Int. Cl.² ......................................... H03F 3/45
[58] Field of Search .................... 330/17, 30 D, 69

[56] References Cited

UNITED STATES PATENTS

| | | | |
|---|---|---|---|
| 3,760,288 | 9/1973 | Leonard | 330/17 X |
| 3,921,090 | 11/1975 | Wheatley, Jr. et al. | 330/30 D |
| 3,922,614 | 11/1975 | van de Plassche | 330/30 D |

*Primary Examiner*—Rudolph V. Rolinec
*Assistant Examiner*—Lawrence J. Dahl
*Attorney, Agent, or Firm*—Maurice J. Jones, Jr.

[57] ABSTRACT

The amplifier configuration includes a double-to-single ended converter having two interconnected portions, each having three signal paths. Two of the signal paths include transistors of a first conductivity type having main electrodes coupled between one of the output terminals of a differential amplifier and a power supply conductor. The other path includes a transistor of the second conductivity type having a control electrode coupled to one of the differential amplifier output terminals and main electrodes coupled between power supply conductors. Identical current sources drive corresponding transistors of each portion. The transistors of the second conductivity type enable quiescent voltages of only one base-to-emitter voltage drop to be developed at each of the output terminals of a differential amplifier to facilitate balance and maximization of the dynamic signal range. The substantially identical configurations of the two portions of the converter enable substantially identical quiescent currents to be drawn thereby to minimize the differential amplifier input offset voltage.

13 Claims, 3 Drawing Figures

MONOLITHIC AMPLIFIER HAVING A BALANCED, DOUBLE-TO-SINGLE ENDED CONVERTER

BACKGROUND OF THE INVENTION

Differential amplifier configurations which each include at least one pair of differentially connected transistors have been advantageously employed in electronic equipment. One advantage of the differential amplifier is that under ideal conditions common-mode input signals do not affect the output signal. More specifically, any signal which causes the inputs of both differentially connected transistors to increase or decrease equally and simultaneously will have no deleterious effect on the differential voltage developed between the collectors of the differentially connected transistors. Therefore, equal changes in the collector-junction leakage currents or in the base-to-emitter voltages with temperature variation of the differential transistors do not affect the magnitude of the differential voltage between the collectors provided that the differentially connected transistors have matched characteristics. Closely matched transistors of the same conductivity type are achievable in monolithic circuits because of the simultaneous processing of components on each wafer. Also, critical components can be placed in close spacial proximity to assure substantially equal temperatures. Hence, undesirable balanced input signals, such as thermally induced voltage and current changes, that are applied equally to each of the monolithic differential transistors are balanced out rather than being passed on to either subsequent stages of the circuit or to the load.

Differential amplifiers having balanced driving circuits are suitable for amplifying input signals from symmetrical signal sources such as strain-gauges, bridge circuits and balanced transmission lines, each of which provide a balanced signal which is not directly referenced to ground. Unbalanced differential amplifiers are suitable for amplifying input signals which are referenced to ground. Regardless of whether the differential amplifier is driven by balanced or unbalanced signal supplies, the output signals developed between the collectors of the differentially connected transistors of the differential amplifier are balanced. Hence, the output signals of differential amplifiers may be directly fed only to a balanced load such as another balanced amplifier. In many applications, it is desired to transform the inherently balanced or double-ended output signal of the differential amplifier into an unbalanced or single ended output signal.

Prior art "turn-around" circuit configurations for providing double-to-single ended or balanced-to-unbalanced conversion sometimes tend to unbalance the differential amplifier itself and thereby destroy many of its inherently desirable characteristics. Also, some prior art turn-around circuit configurations create still other problems. More specifically, one prior art turn-around or double-to-single ended converter stage includes a diode connected transistor which is connected to the collector of one of the differential transistors and another transistor having a base connected to the base of the diode connected transistor and a collector connected both to the collector of the other differential transistor and to the input terminal of an emitter follower amplifier including two transistors. If this turn around configuration is provided in an economical, monolithic integrated circuit form, then the betas or D.C. current gains of the transistors included therein are relatively low. As a result, the difference in base currents demanded from each of the differential transistors by the turn-around circuit during quiescent operation tends to unbalance the differential amplifier. In particular, one of the differential transistors is required to provide base current to two transistors while the other of the differentially connected transistors is required to provide base current to only one transistor. Moreover, the magnitudes of the base currents required by each of the turn-around transistors may be different because of their differing quiescent collector currents.

Consequently, an undesirable "input offset voltage" results across the input terminals of the differential amplifier. Input-offset voltage is defined as the difference in base-to-emitter input potentials required for equal emitter or collector current in the differential transistors. The resulting current mismatch in the differential transistors, which changes as a function of temperature, causes the input-offset voltage to also vary as a function of temperature.

Another disadvantage associated with the above described prior art circuit is that it creates a quiescent voltage at the collector of one of the differential transistors of one $V_{be}$, which is defined as the base-to-emitter voltage of a transistor, and a voltage of $2V_{be}$ at the collector of the other differential transistor. Thus, the maximum amplitude of the dynamic input common mode voltage of the differential amplifier is undesirably limited as a result of the $2V_{be}$ collector voltage.

To solve the limited dynamic range problem of the foregoing prior art circuit, another prior art turn-around circuit has been developed in which a transistor of opposite conductivity type is connected between the emitter follower amplifier and the remainder of the turn-around circuit. Since most present day monolithic circuits are made in N-epitaxial type material, this transistor of opposite conductivity type is of a PNP conductivity. The $V_{be}$ of the PNP transistor increases the maximum magnitude of the common mode dynamic signal by cancelling the effect of the $V_{be}$ of one of the emitter-follower transistors.

Unfortunately, however, the quiescent base current from the PNP transistor tends to further unbalance the collector currents of the differentially connected transistors, unless the beta or D.C. current gain of the PNP transistor is very high. In inexpensive monolithic structures, PNP transistors are normally provided in lateral form. Because of the surface imperfections in such structures, such lateral PNP transistors generally have low betas. Although vertical PNP transistors having high betas can be manufactured using dielectrically isolated monolithic structures, the expense of this process is generally prohibitive. Thus, utilization of low beta PNP transistors in the prior art turn-around circuit to increase the dynamic swing has the adverse effect of further unbalancing the magnitudes of quiescent currents at the collectors of the differentially connected transistors. Consequently, the input offset voltage of such circuits is undesirably increased. Since the input offset voltage is generally monitored during final test of monolithic amplifiers, this increase in input offset voltage causes a decrease in yield and thus an overall increase in the cost of the completed integrated circuit.

SUMMARY OF THE INVENTION

Accordingly, it is one object of this invention to provide an improved amplifier configuration.

Another object of the invention is to provide an improved double-to-single ended converter circuit.

Still another object of the invention is to provide a double-to-single ended converter circuit for a differential amplifier which allows the differential amplifier to have a minimal input offset voltage.

A further object of the invention is to provide a double-to-single ended converter which applies quiescent voltages and currents of substantially equal magnitude to a differential driving source.

A still further object of the invention is to provide a double-to-single ended converter circuit which enables the common mode driving voltage thereof to have a maximized amplitude for a given power supply voltage.

In brief, the amplifier configuration includes a double-to-single ended converter for transforming the balanced signals occurring between the output terminals of a balanced signal supply into a single-ended output signal at an output terminal thereof. The double-to-single ended converter has two portions each having three corresponding interconnected signal paths. One of the signal paths includes a first transistor of a first conductivity type having electrodes coupled between one of the output terminals of the balanced signal source and a power supply conductor. The second path includes a first transistor of the second conductivity type having a control electrode coupled to one of the balanced signal supply output terminals and main electrodes coupled between power supply conductors. The third path includes another transistor of the first conductivity type having main electrodes coupled between the power supply conductors, and a control electrode connected to the first transistor of the second conductivity type. Constant current supplies provide currents of known magnitudes to the corresponding transistors of each of the two portions. The transistors of the second conductivity type enable quiescent voltages of only one base-to-emitter voltage drop to be developed at each of the terminals of the balanced signal supply to facilitate balance and maximization of the undistorted amplitude of the driving signal. Also, the control electrodes of the transistors of the first paths of each of the portions of the double-to-single ended converter are coupled together to facilitate symmetrical operation and equalization of the quiescent currents drawn from the driving terminals of the balanced signal supply to allow balance therein.

DETAILED DESCRIPTION OF THE PREFERRED EMBODIMENT

Figure 1:
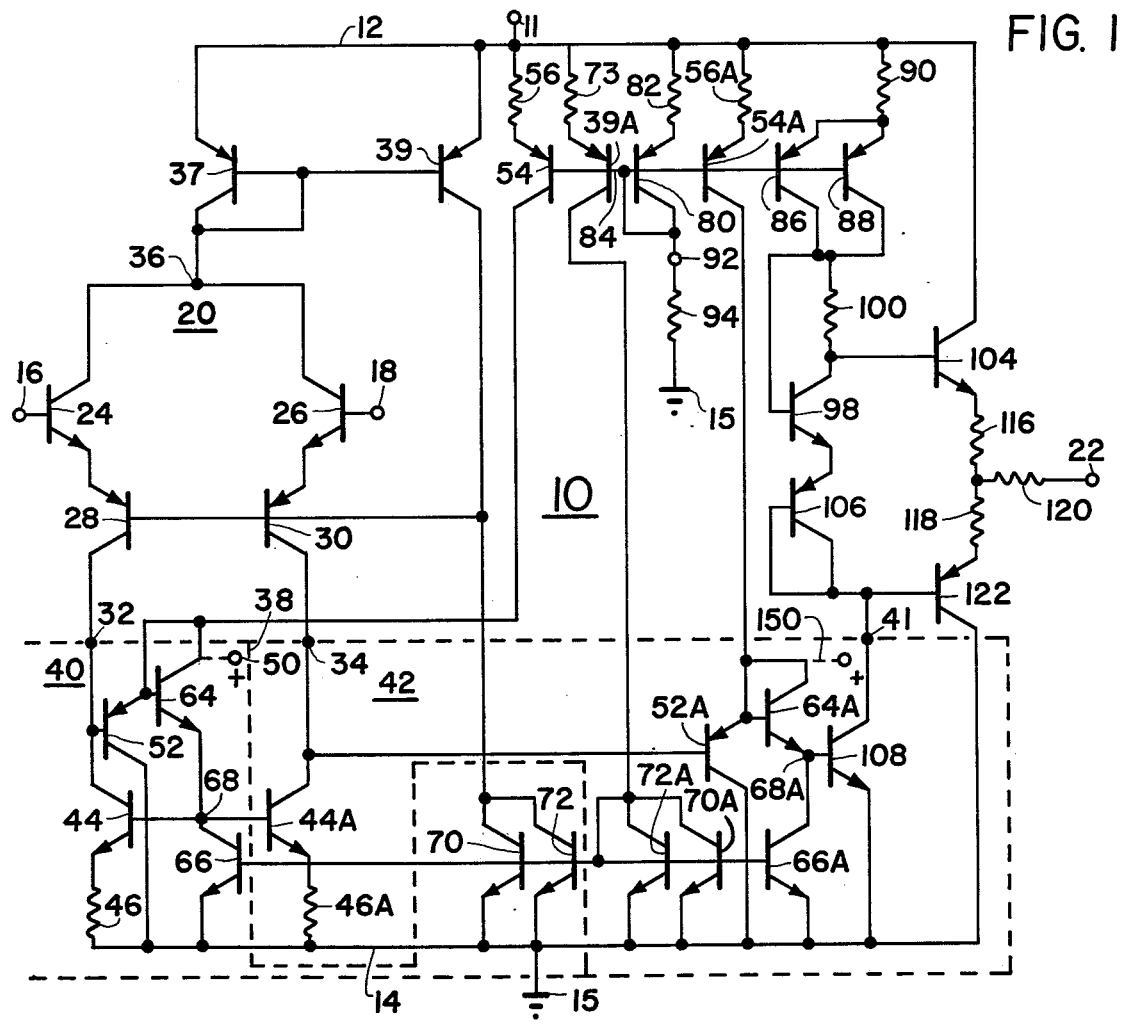
FIG. 1 is a schematic diagram of a monolithic amplifier having the double-to-single ended converter stage of one embodiment of the invention.

FIG. 1 is a schematic diagram of micropower amplifier circuit configuration 10 which is suitable for being provided in monolithic form either by itself or with other circuits and can be designed to draw a minimal amount of current from a power supply having a positive terminal 11 connected to conductor 12 and a negative or ground terminal 15 connected to conductor 14. Amplifier 10 responds to input signals coupled to either or both of input terminals 16 and 18 of differential amplifier 20 to provide an output signal at output terminal 22. Differential amplifier 20 includes a pair of NPN transistors 24 and 26 which have base-to-emitter junctions connected between input terminals 16 and 18 and the emitters of the respective differentially connected coupled PNP transistors 28 and 30. The collector electrodes of transistors 28 and 30 provide common mode or balanced driving signals therebetween at respective nodes 32 and 34. The collectors of transistors 24 and 26 are connected together at node 36. Diode connected transistor 37 is connected between node 36 and conductor 12. PNP current source or supply transistor 39 includes an emitter electrode connected to conductor 12, a base electrode connected to the base electrode of diode connected transistor 37 and a collector electrode connected to the base electrodes of transistors 28 and 30. Transistors 24 and 26 compensate for the low betas or D.C. gains of lateral PNP transistors 28 and 30 which could otherwise cause the input impedance and input bias current of amplifier 10 to be undesirably low.

Regardless of whether differential amplifier 20 is driven in its balanced or unbalanced mode, a balanced output signal is developed between nodes 32 and 34. Double-to-single ended converter circuit 38 converts the balanced signal into an unbalanced signal at output terminal 41. Converter 38 includes one portion 40 which is connected to the collector of differential transistor 28 and another portion 42 which is connected to the collector of differential transistor 30. Under quiescent operation conditions, portions 40 and 42 draw substantially constant collector currents of substantially equal magnitudes from transistors 28 and 30 so that the differential input voltage generated between input terminals 16 and 18 is minimized. Moreover, portions 40 and 42 enable the common mode voltages between terminals 32 and 34 to swing within one $V_{be}$ of the potential applied to conductor 14 during dynamic operation.

More specifically, circuit portion 40 provides a first path from the collector of transistor 28 through node 32 to conductor 14 through the series circuit including the collector-to-emitter junction of transistor 44 and resistor 46. Similarly, circuit portion 42 provides a first path from the collector of transistor 30 through node 34 to conductor 14 through the series circuit including the collector-to-emitter junction of transistor 44A and resistor 46A. The resistance of resistors 46 and 46A are equal and can be on the order of 10 kiloohms.

Also, portion 40 provides a second path from the collector of transistor 28 through the base-to-collector junction of PNP transistor 52 which has an emitter electrode connected to the collector of a current source transistor 54, a base electrode coupled to node 32, and a collector electrode directly connected to conductor 14. Emitter resistor 56 connects the emitter of current source transistor 54 to conductor 12.

Similarly, circuit portion 42 provides a second path from the collector of transistor 30 through the base-to-collector junction of PNP transistor 52A which has a collector electrode directly connected to conductor 14, a base electrode connected to node 34, and an emitter electrode connected to the collector electrode of current supply transistor 54A. Emitter resistor 56A connects the emitter of transistor 54A to conductor 12. Resistors 56 and 56A have equal resistances which can each be of about 2 kilohms.

Moreover, portion 40 provides a third path including NPN transistors 64 and 66. More specifically, diode connected transistor 64 includes a collector electrode which is connected to the collector electrode of transistor 54, a base electrode which is connected to the emitter electrode of transistor 52 and an emitter electrode which is connected to junction 68 of the base electrodes of transistors 44 and 44A and the collector electrode of transistor 66. The base electrode of transistor 66 is connected to biasing or current supply transistors 70 and 72 which have emitter electrodes connected to conductor 14 and collector electrodes connected to the collector of current source transistor 39.

Similarly, portion 42 provides a third path including NPN transistors 64A and 66A. Diode connected transistor 64A has base and collector electrodes connected to the collector of current source transistor 54A and an emitter electrode connected to node 68A which can be considered as the output terminal of portion 42. NPN transistor 66A has a collector electrode which can be connected to node 68A, a base electrode connected to the base electrodes of transistors 70A and 72A, and an emitter electrode connected to conductor 14. Transistors 70A and 72A have emitter electrodes connected to conductor 14, collector electrodes connected to the collector of current supply transistor 39A, and base electrodes connected to base electrode of transistor 72 and transistor 66A. Resistor 73 couples the emitter of transistor 73 to conductor 12 and can have a resistance of 2 kilohms.

Hence, circuit portions 40 and 42 each include three paths having transistors of corresponding conductivity types and corresponding geometry in each path and resistances of equal value in each path. Moreover, the second and third paths of each portion 40 and 42 are respectively operated by corresponding current supply transistors which are capable of providing currents of substantially the same magnitudes. Thus, circuit portions 40 and 42 have structural symmetry with respect to each other so that they draw equal currents from each of nodes 32 and 34, which enables a minimization of the input offset voltage between terminals 16 and 18 of differential amplifier 20.

Diode connected transistor 80 includes an emitter electrode coupled through resistor 82 to conductor 12 and a base electrode connected to conductor 84, which connects the base electrodes of transistors 54, 39A, 80, 54A, 86, and 88 together. The emitters of transistors 86 and 88 are connected through resistor 90 to conductor 12. Bonding pad or pinout terminal 92 is connected to the collector of transistor 80. Resistor 94 is connected between terminal 92 and reference point 15. The resistance of external, discrete resistor 94 can be selected by the user of amplifier 10 for setting the magnitudes of the currents provided by the collectors of all of the current supply transistors having base electrodes connected to conductor 84.

The collector electrodes of transistors 86 and 88 are directly connected to the base electrode of transistor 98. Resistor 100 connects the collector electrodes of transistors 86 and 88 to the collector electrode of transistor 98 and to the base electrode of complementary output NPN transistor 104. Diode connected transistor 106 is coupled between the emitter electrode of transistor 98 and the collector electrode of driver transistor 108. A resistive T network including resistors 116, 118 and 120, is connected between the emitter electrodes of complementary output transistors 104 and 122. Resistors 116, 118 and 120 can each have the same resistance which might be on the order of 100 ohms. PNP transistor 122 further includes a base electrode connected to the collector electrode of transistor 106 and a collector electrode connected to conductor 14.

QUIESCENT OPERATION

The quiescent operation of circuit 10 will be described next. When a supply voltage is developed between conductors 12 and 14, diode connected transistor 80 is rendered conductive and provides bias to current supply transistors 54, 39A, 54A, 86 and 88. Under quiescent conditions, transistors 98 and 106 are responsive to the current conducted by transistors 86 and 88 to provide Class AB bias to complementary output transistors 104 and 122. Current supply transistor 39A energizes transistors 70A and 72A which provide bias for parallel connected transistors 70 and 72. Moreover, current supply transistors 54 and 54A respectively provide drive current to transistors 52, 64 and 52A, 64A. Transistors 70, 72 and 70A, 72A enable transistors 66, 66A to conduct so that transistors 44, 44A, 52, 52A, 64 and 64A are operated at their bias points. Consequently, transistors 28, 30, 24, 26, 39 and diode connected transistor 37 are operated at their quiescent bias levels.

The symmetry of portions 40 and 42 of differential-to-single ended converter 38 results in equal quiescent voltage levels of minimum magnitudes being applied to terminals 32 and 34. More specifically, a quiescent level of $2V_{be}$ is created at the base of transistor 64 by the base-to-emitter junctions of transistors 64 and 66 which are connected in series between the base of transistor 64 and conductor 14. PNP transistor 52 develops a base-to-emitter voltage of opposite polarity with respect to the $2V_{be}$ at the base of transistor 64. Consequently, a voltage of $1V_{be}$ is applied to the terminal 32 under quiescent conditions.

Similarly, a quiescent voltage of $2V_{be}$ is developed at the base electrode of transistor 64A by the series combination of the base-to-emitter junctions 64A and transistor 66A. This voltage of $2V_{be}$ is reduced by the opposite polarity base-to-emitter voltage of PNP transistor 52A. Consequently, a quiescent voltage magnitude of $1V_{be}$ is developed at terminal 34. Thus, PNP transistors 52 and 52A enables the dynamic driving voltage between nodes 32 and 34 to have maximum amplitude.

Also, the quiescent current demanded from nodes 32 and 34 by respective portions 40 and 42 of differential-to-single ended converter 38 have substantially equal magnitudes. More specifically, the current from node 32 is equal to the quiescent collector current of NPN transistor 44 and the quiescent base current of PNP transistor 52. Similarly, the quiescent current drawn from node 34 is equal to the quiescent collector current of NPN transistor 44A and the quiescent base current of PNP transistor 52A. Transistors 44 and 44A draw substantially the same collector currents because they are matched in structure and geometry, emitter resistors 46 and 46A have the same resistances, and both transistors are biased up by the same collector voltage of transistor 66.

PNP transistors 52 and 52A draw base currents of about the same magnitude because they are matched in geometry and structure and they are respectively biased up by the series connection of NPN transistors 64 and 66 and NPN transistors 64A and 66A. Current sources 54 and 54A provide currents of equal magnitudes to the emitters of PNP transistors 52 and 52A, to further enable the base currents thereof to have equal magnitudes during quiescent conditions. In addition, transistors 66 and 66A are biased by equal voltages and currents developed respectively across transistors 70, 70A in response to currents of substantially equal magnitudes provided by current supply transistors 39 and 39A. The equalization of the quiescent currents from nodes 32 and 34 enables minimization of the input offset voltage between input terminals 16 and 18 of amplifier 20.

Since current sources are employed by circuit 10 in all current flow paths from conductor 12 to conductor 14, the magnitude of the quiescent current flow therebetween can be precisely controlled to a desired minimal magnitude by the resistance of external, discrete current setting resistor 94.

Figure 2:
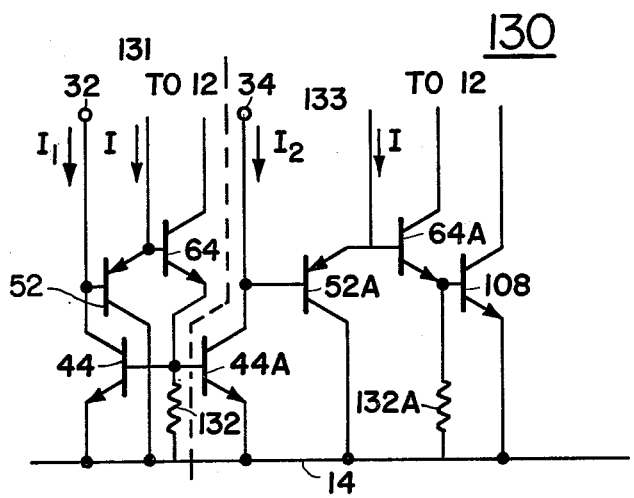
FIG. 2 is a partial schematic diagram illustrating an alternative single-to-double ended converter circuit for utilization in the amplifier of FIG. 1.

FIG. 2 is a partial schematic of double-to-single ended converter circuit 130 which can be substituted for circuit 38 of FIG. 1. Identical reference numbers are used in FIG. 2 to designate components corresponding to those of circuit 38. Circuit 130 includes balanced portions 131 and 133. In the circuit 130 of FIG. 2, the emitter electrodes of transistors 44 and 44A are directly connected to conductor 14 rather than through resistors 46 and 46A. Resistor 132 is connected from conductor 14 to the base electrodes of transistors 44 and 44A, instead of transistor 66. Moreover, resistor 132A is connected between the emitter electrode of transistor 64A and conductor 14, rather than transistor 66A. The collectors of transistors 64 and 64A can be directly connected to conductor 12.

The quiescent operation of circuit 130 of FIG. 2 is similar to that described for circuit 38 of FIG. 1. In particular, resistor 132 develops a bias voltage for transistors 44 and 44A and resistor 132A develops a bias voltage for transistor 108. Circuit 130 has similar structural and functional symmetry to that previously described for circuit 38 which enables low input offset voltage. Since resistors 132 and 134 might take up less area than corresponding transistors 66 and 66A embodiment 130 of FIG. 2 might be less expensive to manufacture than the embodiment of FIG. 1.

DYNAMIC OPERATION

Figure 3:
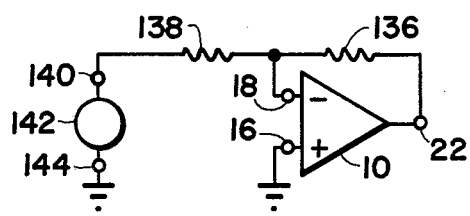
FIG. 3 is a diagram illustrating one possible connection of the amplifier of FIG. 1.

FIG. 3 indicates one of many possible connections of amplifier 10. More specifically, resistor 136 is connected between output terminal 22 and inverting input terminal 18. Resistor 138 is connected from input terminal 18 to output terminal 140 of signal supply 142. Terminal 144 of signal supply 142 and noninverting input terminal 16 of amplifier 10 are connected to a ground or reference potential point 144. The ratio of the resistances or resistors 136 and 138 determine the gain of amplifier 10 and the resistance of resistor 138 determines the input impedance. A single ended signal is applied from signal supply terminal 140 through resistor 138 to terminal 18 of amplifier 10.

For the purpose of explaining the dynamic operation, it is assumed that the input signal is of sinusoidal form and initially increasing in magnitude in the positive direction. Accordingly transistor 26 is rendered more conductive so that transistor 30 is similarly rendered more conductive. As a result, transistors 24 and 28 become less conductive. Thus, a differential driving signal is developed between terminals 32 and 34 with a relatively positive going signal appearing at node 34 and a relatively negative going signal appearing at node 32. Consequently, transistor 52 is rendered more conductive which tends to reduce the base drive to transistor 64. Consequently transistors 44 and 44A are rendered less conductive so that the voltage at the collector of transistor 44A increases in a positive direction. Consequently, transistor 52A is rendered less conductive so that the voltage at its emitter increases to thereby cause transistors 64A and 108 to be rendered more conductive. Consequently, additional base drive is drawn through transistor 122 which tends to lower the voltage at terminal 22 and less base drive is provided for transistor 104, which tends to cooperate with the operation of transistor 122 to further lower the voltage at terminal 22 in response to the voltage of increasingly positive magnitude at inverting input terminal 18.

Alternatively, as the input signal at terminal 18 becomes increasingly negative, the foregoing transistors which were described as increasing in conductivity now decrease in conductivity and vice versa. More specifically, transistors 26 and 30 become less conductive which results in transistors 24, 28, 44, 64, 44A, and 52A becoming more conductive. Consequently, transistors 64A, 108 and 122 are rendered less conductive and transistor 104 becomes more conductive to raise the voltage at terminal 122 in response to the voltage of increasingly negative magnitude at inverting input terminal 18.

Diode connected transistor 64A prevents excessive base current from entering transistor 108 when it saturates due to a large amount of negative output swing. Transistor 64 is also diode connected to maintain voltage and current symmetry. Alternatively, the collectors of transistors 64 and 64A could be connected directly to conductor 12 as indicated by dashed lines 150 of FIG. 1 or as shown in FIG. 2 to increase the maximum excursion of the dynamic signals. In this case alternate circuitry must be provided to prevent excessive base current in transistor 108 when it is saturated. Such circuitry might include a diode connected from the base of transistor 64A to the collector of transistor 108. Transistors 86 and 88 are connected in parallel to provide a base drive of sufficient magnitude to transistor 104 so that output terminal 22 can be driven to a maximized magnitude.

Therefore, an improved amplifier configuration 10 has been described. PNP transistors 52 and 52A enable differential-to-single ended converters 38 and 130 to allow differential amplifier 20 to have a maximum dynamic output voltage by applying quiescent voltages of $1V_{be}$ between each of terminals 32 and 34 and conductor 14. Moreover, the inherent symmetry of the structure of portions 40 and 42 of circuit 38 and of portions 131 and 133 of circuit 130 along with the equalization of magnitudes of the currents provided by current supply transistors 54 and 54A result in currents of substantially equal magnitudes being drawn from nodes 32 and 34 of differential amplifier 20 to minimize the contribution of the turn-around circuit to the input offset voltage and thereby increase the yield of monolithic chips employing the circuits of FIGS. 1 and 2.

I claim:
1. A balanced, differential-to-single ended converter circuit having first and second nodes for receiving a differential signal, the differential-to-single ended converter circuit transforming the differential signal into a single ended signal at an output thereof and including in combination;

power supply means for supplying a voltage between first and second conductors thereof;

first and second circuit portions each having first, second and third paths;

each of said first paths including a first transistor of one conductivity type having a first electrode, a control electrode, and a second electrode;

each of said second paths including a transistor of the other conductivity type having a first electrode, a control electrode coupled to said second electrode of said first transistor and to one of said first and second nodes, and a second electrode connected to said second conductor;

each of said third paths including a second transistor of said one conductivity type having a first electrode, a second electrode, and a control electrode connected to said first electrode of said first transistor of said other conductivity type, said first electrode of said second transistor of said one conductivity type of said second portion providing the output terminal for the converter;

first circuit means connecting said first electrodes of said first transistors of said one conductivity type to said second conductor;

second circuit means connecting said control electrodes of said first transistors of said one conductivity type to said second conductor; and third circuit means electrically coupling said first electrodes of said transistors of said other conductivity type to said first conductor.

2. The differential-to-single ended converter circuit of claim 1 wherein said first circuit means includes resistive means and said second circuit means includes a further transistor of said one conductivity type.

3. The differential-to-single ended converter circuit of claim 1 wherein said second circuit means includes resistive means.

4. The differential-to-single ended converter circuit of claim 1 wherein said third circuit means includes current supply means connected between said first conductor and said first electrode of each of said transistors of said other conductivity type.

5. The differential-to-single ended converter circuit of claim 1 further including driver transistor means of said one conductivity type having a control electrode connected to said first electrode of said second transistor of said one conductivity type of said second portion.

6. A double-to-single ended converter circuit suitable for being connected to first and second output terminals of a differential amplifier, the converter transforming the balanced signal occurring between the first and second output terminals of the differential amplifier into an unbalanced signal at an output terminal thereof and including in combination:

first power supply connecting means for supplying a potential of a first magnitude;

second power supply connecting means for supplying a potential of a second magnitude;

a first circuit path having a transistor of a first conductivity type with a first electrode coupled to said second power connecting supply means, a second electrode connected to the first differential amplifier output terminal and a control electrode;

first current supply means adapted to provide a current of a predetermined magnitude at an output terminal thereof;

a second circuit path including a transistor of the second conductivity type with a first electrode connected to said output terminal of said first current supply means, a control electrode connected to the first differential amplifier output terminal, and a second electrode connected to said second power supply connecting means;

a third circuit path including a second transistor of said first conductivity type having a first electrode connected to said control electrode of said first transistor of the first conductivity type, a control electrode connected to said first electrode of said first transistor of said second conductivity type, and a second electrode coupled to said first power supply connecting means;

first circuit means connecting said control electrode of said first transistor means of said first conductivity type and said first electrode of said second transistor of said first conductivity type to said second power supply connecting means;

a fourth circuit path including a third transistor of said first conductivity type having a first electrode coupled to said second power supply connecting means, a control electrode connected to said control electrode of said first transistor of said first conductivity type, and a second electrode connected to the second differential amplifier output terminal;

second current supply means adapted to provide a current of said predetermined magnitude at an output terminal thereof;

a fifth circuit path including a second transistor of said second conductivity type having a first electrode connected to said output terminal of said second current supply means, a control electrode connected to said second electrode of said third transistor of said first conductivity type, and a second electrode connected to said second power supply connecting means;

a sixth circuit path including a fourth transistor of said first conductivity type having a first electrode providing the output terminal of the double-to-single ended converter, a control electrode connected to said first electrode of said second transistor of said second conductivity type, and a second electrode coupled to said first power supply connecting means; and second circuit means connecting said first electrode of said fourth transistor of said first conductivity type to said second power supply connecting means.

7. The double-to-single ended converter circuit of claim 6 wherein said first circuit means and said second circuit means each include resistive means.

8. The double-to-single ended circuit of claim 6 wherein said first circuit means and said second circuit means each include a further transistor of said first conductivity type.

9. The double-to-single ended converter circuit of claim 6 wherein said second electrodes of said second transistor of said first conductivity type and said fourth transistor of said first conductivity type are directly connected to said first power supply connecting means.

10. The double-to-single ended converter circuit of claim 6 wherein:

said second electrodes of said second transistor of said first conductivity type is connected to said output terminal of said first current supply means; and said second electrode of said fourth transistor of said second conductivity type is connected to said output terminal of said second current supply means.

11. A balanced double-to-single ended converter for transforming balanced signals occurring between the output terminals of a balanced signal supply into a single-ended output signal at an output terminal thereof, the single-to-double ended converter including in combination:

first power supply conducting means for providing a voltage of a first magnitude;

second power supply conducting means for providing a voltage of a second magnitude;

first current supply means for providing a current of a known predetermined magnitude at an output terminal thereof;

second current supply means for providing a current of said known predetermined magnitude at an output terminal thereof;

first and second circuit portions each including first, second and third signal paths, each of said first paths including a first transistor of a first conductivity type having main electrode coupled between said second power supply conductor and one of the output terminals of the balanced signal supply, each of said second paths including a transistor of a second conductivity type having main electrodes coupled between said output terminal of one of said current supply means and said second power supply conductor means and a control electrode connected to one of the output terminals of the balanced signal supply, and each of said third paths including a second transistor of said first conductivity type having main electrodes coupled between said first and second power supply conductors and a control electrode connected to one of the main electrodes of said transistor of said second conductivity type; and first circuit means connecting the control electrodes of the first transistors of the first conductivity type of each portion together and to the second power supply conducting means.

12. The double-to-single ended converter of claim 11 wherein:

said first circuit means includes a further transistor of the first conductivity type having a first electrode connected to said second power supply conducting means, a second electrode connected to said control electrodes of said first transistors of the first conductivity type, and a control electrode; and third current supply means having an output terminal connected to said control electrode of said further transistor of the first conductivity type.

13. The double-to-single ended converter circuit of claim 11, further including:

driver transistor having a control electrode connected to said first electrode of said second transistor of said first conductivity type of said second portion, a first electrode connected to said second power supply conducting means, and a second electrode for providing an additional output terminal.

* * * * *